(12) United States Patent
Moczygemba

(10) Patent No.: US 12,102,254 B2
(45) Date of Patent: Oct. 1, 2024

(54) NON-ELECTRIC POWERED, OFF-GRID, BEVERAGE BREWER

(71) Applicant: Joshua Edward Moczygemba, Winona, TX (US)

(72) Inventor: Joshua Edward Moczygemba, Winona, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 172 days.

(21) Appl. No.: 17/329,746

(22) Filed: May 25, 2021

(65) Prior Publication Data

US 2021/0289977 A1 Sep. 23, 2021

Related U.S. Application Data

(63) Continuation of application No. 16/554,127, filed on Aug. 28, 2019, now Pat. No. 11,553,814.

(51) Int. Cl.
| | | |
|---|---|---|
| *A47J 31/00* | (2006.01) | |
| *A47J 31/24* | (2006.01) | |
| *A47J 31/46* | (2006.01) | |
| *A47J 31/52* | (2006.01) | |
| *A47J 31/54* | (2006.01) | |
| *H10N 10/80* | (2023.01) | |

(52) U.S. Cl.
CPC ............. *A47J 31/005* (2013.01); *A47J 31/24* (2013.01); *A47J 31/468* (2018.08); *A47J 31/525* (2018.08); *A47J 31/54* (2013.01); *H10N 10/80* (2023.02)

(58) Field of Classification Search
CPC .......... A47J 31/005; A47J 31/32; A47J 31/34; A47J 31/24; H05L 35/28; H05L 35/34
See application file for complete search history.

(56) References Cited

U.S. PATENT DOCUMENTS

| | | |
|---|---|---|
| 6,672,200 B2 | 1/2004 | Duffy et al. |
| 6,739,241 B2 | 5/2004 | Long et al. |
| 7,935,882 B2 | 5/2011 | Pickard et al. |
| 2002/0144602 A1 | 10/2002 | Taylor et al. |
| 2006/0172245 A1 | 8/2006 | Hu et al. |

(Continued)

FOREIGN PATENT DOCUMENTS

| | | |
|---|---|---|
| CN | 101925319 A | 12/2010 |
| EP | 2225978 A1 | 9/2010 |
| GB | 2531608 A | 4/2016 |

OTHER PUBLICATIONS

Kickstarter, "The Coffeeboxx(TM): The World's Toughest Coffee Maker," downloaded from www.kickstarter.com, last updated Apr. 15, 2015, 28-pgs.

(Continued)

*Primary Examiner* — Reginald Alexander
(74) *Attorney, Agent, or Firm* — Blank Rome LLP

(57) ABSTRACT

This disclosure provides methods and apparatus for a beverage brewer. The beverage brewer including a burner, a reservoir, a controller, and a thermoelectric generator. The burner produces combustible heat across a surface. The reservoir stores a brewing fluid. The controller controls a brewing process. The thermoelectric generator is structured with a supply side, a waste side and a power output. The supply side is directed towards the surface of the burner. The waste side contacts the reservoir. The power output powers the controller.

25 Claims, 8 Drawing Sheets

(56) References Cited

U.S. PATENT DOCUMENTS

| | | |
|---|---|---|
| 2010/0282089 A1 | 11/2010 | Boussemart et al. |
| 2014/0178548 A1 | 6/2014 | Drummond et al. |
| 2015/0182046 A1 | 7/2015 | Walsh |
| 2016/0058242 A1 | 3/2016 | Viet-Doan |
| 2016/0076774 A1 | 3/2016 | Defoort et al. |
| 2016/0284965 A1 | 9/2016 | Makosinski et al. |
| 2017/0231426 A1 | 8/2017 | Barford |
| 2022/0125234 A1* | 4/2022 | Richardson ............ A23F 5/262 |

OTHER PUBLICATIONS

Makita, "Cordless Coffee Maker," Instruction Manual DCM501, undated, downloaded from www.makita.com on May 7, 2021, 28-pgs.

Makita, "Model DCM501Z Parts List," downloaded from www.makitatools.com, dated Feb. 2019, 2-pgs.

Makita, "DCM501Z," Product Brochure, undated, downloaded from www.makitatools.com on May 7, 2021, 1-pg.

Coleman, "Portable Propane Coffeemaker," Instruction Manual, copyright 2010, 20-pgs.

Brunton, "Brewfire(TM): Instructions for Propane / Butane—Coffee Maker," User Manual, undated, downloaded from www.manualslib.com on May 7, 2021, 8-pgs.

Keurig, "Keurighot(TM): K130 Commercial Series," Owner's Manual, copyright 2016, 28-pgs.

Office Action issued in Chinese Patent Application No. 202010886211.5 on Jan. 25, 2022 with English Translation.

* cited by examiner

NON-ELECTRIC POWERED, OFF-GRID, BEVERAGE BREWER

CROSS-REFERENCE TO RELATED APPLICATIONS

This is a continuation of U.S. application Ser. No. 16/554,127 filed 28 Aug. 2019, which is incorporated herein by reference.

TECHNICAL FIELD

The present application relates generally to beverage brewers and, more specifically, to a non-electric powered, off-grid, single serve beverage brewer.

BACKGROUND

Beverage brewers, such as single serve coffee makers, that are currently available require electrical power sources to operate the heating elements used to heat the brew water. Battery operated systems are simply not practical due to the required size of battery need to perform this task. The biggest reason is the significant power draw required to boil water. Using gas burners to heat the water not only provided the necessary energy to heat the water, but also provides a source of heat that can be converted to electricity by thermoelectric generators.

SUMMARY

This disclosure provides a non-grid powered, portable beverage brewer.

In a first embodiment, a beverage brewer is provided. The beverage brewer includes a burner, a hydrocarbon based fuel, a reservoir, a brew compartment, a controller, and a thermoelectric generator. The burner produces combustible heat across a surface. The reservoir stores a brewing fluid. The controller controls a brewing process. The thermoelectric generator is structured with a supply side, a waste side and a power output. The supply side is directed towards the surface of the burner. The waste side contacts the reservoir. The power output powers the controller.

In certain embodiments, a method for brewing a beverage is provided. The method includes producing combustible heat across a surface of a burner; storing a brewing fluid in a reservoir; controlling a brewing process using a controller; providing a supply side of a thermoelectric generator towards the surface of the burner; providing a waste side of the thermoelectric generator to contact the reservoir, and powering the controller and associated electrical components (pump, LED's, battery) using a power output of the thermoelectric generator.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 9, discussed below, and the various embodiments used to describe the principles of the present disclosure in this patent document are by way of illustration only and should not be construed in any way to limit the scope of the disclosure.

Adding thermoelectric generation capability to the beverage brewer negates the need to provide any electrical power source for the other elements of the beverage brewer (such as pumps, displays, igniters, solenoids, etc.). This approach eliminates the need for battery replacement or recharging by the user.

Figure 1B:
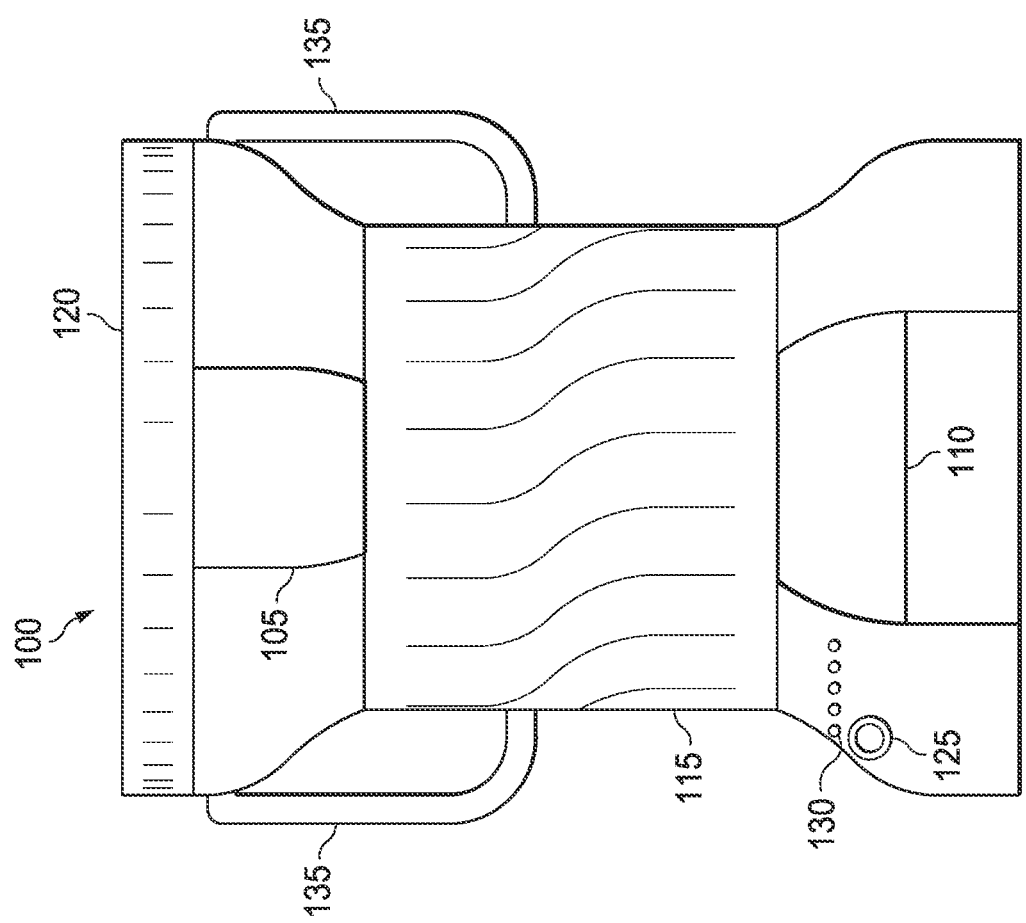
FIGS. 1A and 1B illustrate an exemplary exterior view of a non-grid powered, single beverage brewer in accordance with various embodiments of the present disclosure.
Figure 1A:
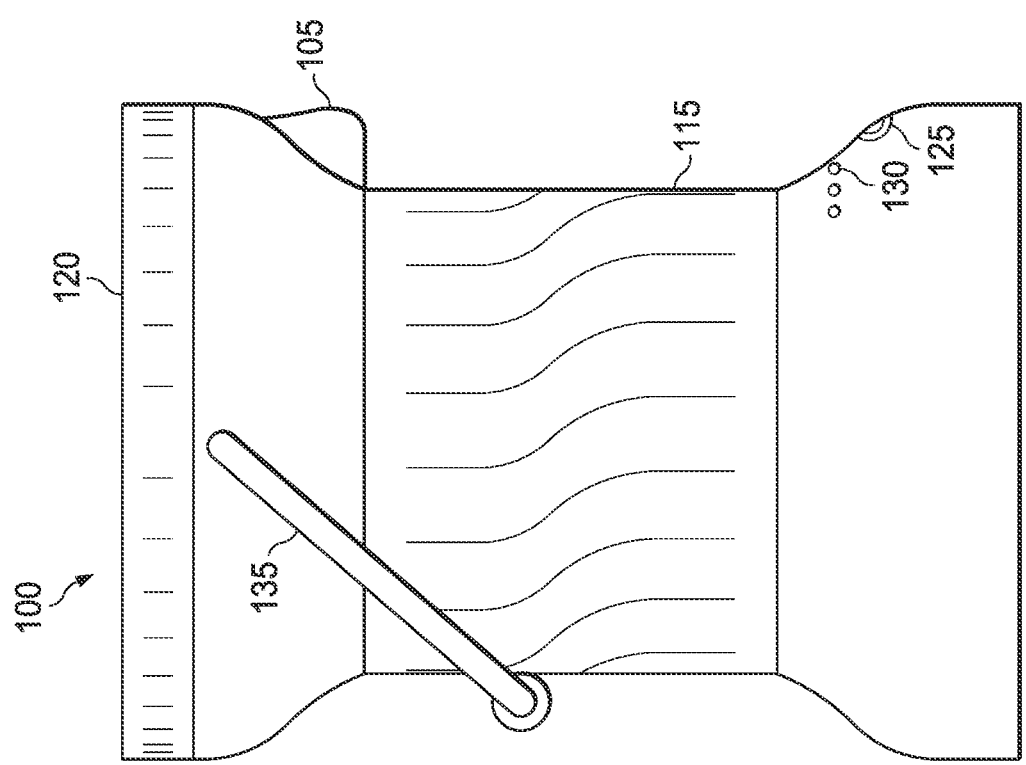

FIGS. 1A and 1B illustrate an exemplary exterior view of a non-grid powered, beverage brewer 100 in accordance with various embodiments of the present disclosure. The embodiment of the non-electric powered, off-grid, beverage brewer 100 illustrated in FIGS. 1A and 1B is for illustration only. FIGS. 1A and 1B do not limit the scope of this disclosure to any particular implementation of a beverage brewer.

The beverage brewer 100 is portable and can use a thermoelectric generator (TEG) to convert the heat from a heat source into an electric current to power any electrical components in the beverage brewer 100. The beverage brewer 100 does not require an exterior power source for brewing a cup of coffee. The exterior of the beverage brewer 100 can include a brew dispenser 105, a cup platform 110, a vented body 115, a lid 120, a start button 125, one or more status indicators 130, and a handle 135.

The brew dispenser 105 stores a coffee serving in a compartment at the top of the beverage brewer 100. The brew dispenser 105 is sized for a single serving of coffee. The brew dispenser 105 can extend out from the lid of the beverage brewer 100 to align an output of the brewing chamber 252 (illustrated in FIG. 2) with cup platform 110.

The cup platform 110 is located at the base of the beverage brewer 100. The cup platform 110 is aligned with the outlet of the brew dispenser 105. The cup platform 110 can hold a container for the coffee to be stored in.

Figure 2:
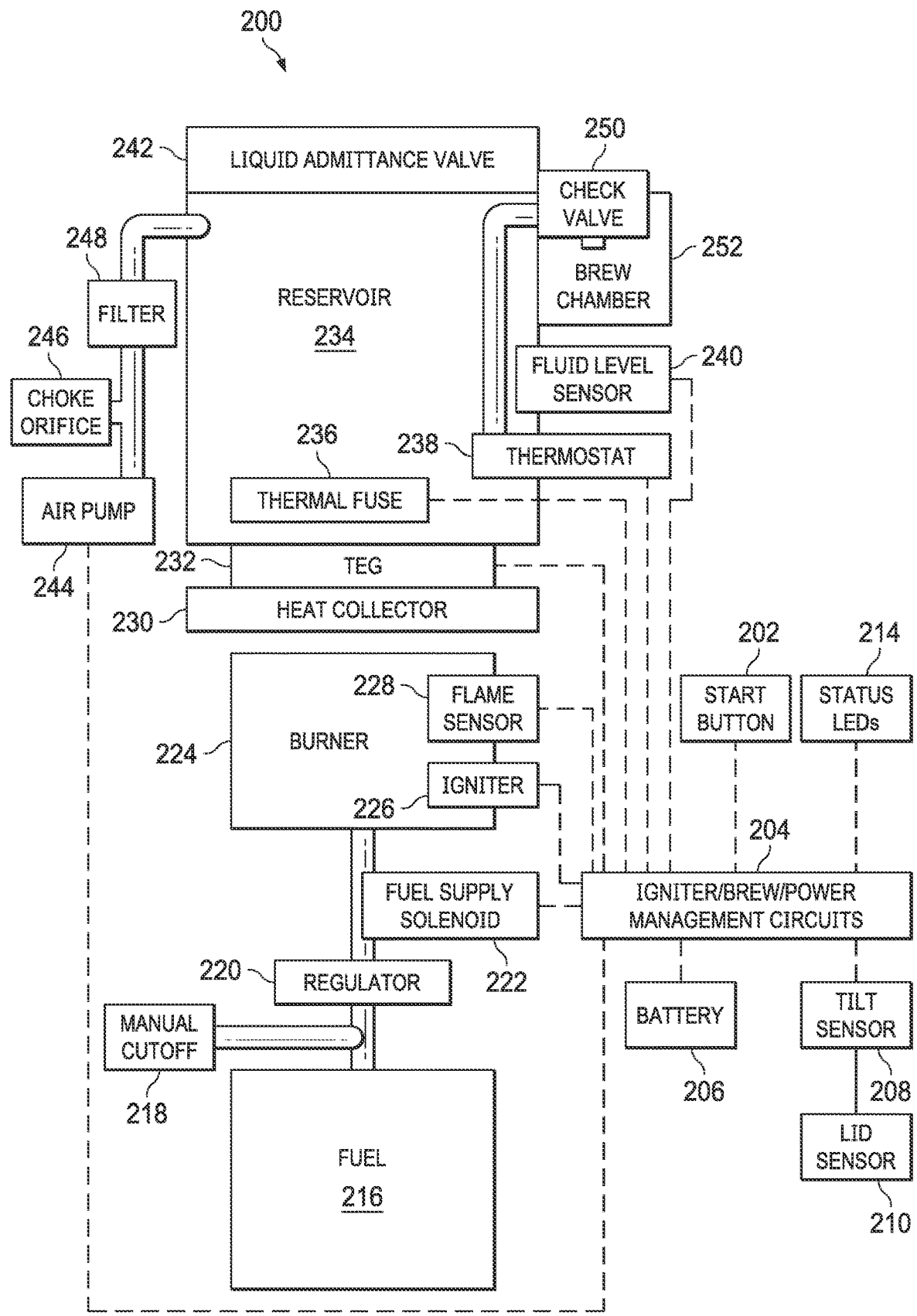
FIG. 2 illustrates an exemplary interior view of a non-electric powered, off-grid, beverage brewer in accordance with various embodiments of the present disclosure.

The vented body 115 provides venting from the exhaust of the burner 224 (illustrated in FIG. 2). The vented body 115 can be made of a material that can withstand a significant amount of heat generated at the burner and can contain the heat generated while the exhaust is vented. The vented body 115 can have designs created with the vents for a more ornate appearance of the beverage brewer 100.

The lid 120 provides for inserting water into the beverage brewer 100 through the liquid admittance valve 242 (illustrated in FIG. 2). The lid 120 can be structured with designs for a more ornate appearance of the beverage brewer 100.

The start button 125 can be located on the exterior of the beverage brewer 100. The start button 125 can be connected to a management circuit 204.

The one or more status indicators 130 can indicate different statuses of the beverage brewer 100. For example, the status indicators 130 can include a temperature indicator, a completed indicator, a brewing indicator, a reservoir level indicator, etc. The status indicators 130 can be LEDs or other type of optical indicators. The status indicators 130 can be connected directly to the management circuits 204 or to different sensors, such as a tilt sensor 208, to indicate the measurement of the respective sensor.

The handle 135 can connect to the outside of the beverage brewer 100. The handle can have a corresponding groove or recess that allows for the handle to lie flush with the outer surface of the beverage brewer 100.

FIG. 2 illustrates an exemplary interior view 200 of a non-grid powered, beverage brewer 100 in accordance with various embodiments of the present disclosure. The embodiment of the internal view 200 illustrated in FIG. 2 is for illustration only. FIG. 2 does not limit the scope of this disclosure to any particular implementation of a beverage brewer.

The interior of the beverage brewer 100 includes the components for brewing the coffee and regulating the control of the beverage brewer 100. These components can include a start button 202, one or more management circuits 204, a chargeable battery 206, a tilt sensor 208, a lid sensor 210, one or more status LEDs 214, a fuel container 216, a manual cutoff 218, a regulator 220, a fuel supply solenoid 222, a burner 224, an igniter 226, a flame sensor 228, a heat collector 230, a thermoelectric generator 232, a reservoir 234, a thermal fuse 236 attached to the reservoir, a thermostat 238, a fluid level sensor 240, a liquid admittance valve 242, an air pump 244, a choke orifice 246, a filter 248, a check valve 220, and a brewing chamber 252.

The start button 202 can be located on the exterior of the beverage brewer 100. The start button 202 can be depressed to begin the brewing process. The start button 202 can be connected to the management circuit 204. The start button 202 can cause the management circuit 204 to begin operating using stored power in the battery 206.

The management circuits 204 receives the sensor reading from the different tilt sensor 208, flame sensor 228, temperature sensor 238, etc. The management circuits 204 receive power from the battery 206 and the TEG 232. The management circuits 204 can control the different parts of the process of the beverage brewer 100 including controlling the burner 224, the ignition 226, the gas solenoid 222, and the pump 244.

The battery 206 is primarily charged by the TEG 232. The battery 206 can be a rechargeable battery that is used to power the electrical components of the beverage brewer 100. The battery 206 can store enough power to operate certain sensors and electrical components (spark igniter, pump, solenoid) related to the beverage brewer 100. For instance, when the start button 202 is activated, the battery 206 can provide power to open the gas solenoid and trigger the spark igniter to light the burner for heating the brewing fluid.

The tilt sensor 208 can be located at the base of the beverage brewer 100. The tilt sensor 208 is connected to the management circuits 204. When the beverage brewer 100 is tilted past a specific degree, the tilt sensor 208 can cause the management circuits 204 to shut off the burner 224. If the burner 224 is burning at an angle or upside, the beverage brewer 100 could start an unplanned fire or potential explosion. The management circuits 204 can be one or both of the igniter circuit and the brew cycle and power management circuit.

The lid sensor 210 can be mounted on the lid of the beverage brewer 100 and connected to the management circuit 204. The lid sensor 210 can detect when a lid or cover is attached to the beverage brewer 100. When the lid sensor 210 does not indicate to the management circuits 204 that the lid is attached, the management circuits shut down the beverage brewer 100.

The status indicators 214 can be located on an external part of the base of the beverage brewer and can indicate different statuses of the beverage brewer 100. For example, the status indicators 214 can include a temperature indicator, a completed indicator, a brewing indicator, a reservoir level indicator, etc. The status indicators 130 can be LEDs or other type of optical indicators. The status indicators 214 can be connected directly to the management circuits 204 or to different sensors, such as a tilt sensor 208, to indicate the measurement of the respective sensor.

The fuel container 216 can contain fuel meant for the burner 224. The fuel container 216 can be removable/replaceable. The fuel container 216 is located at the base of the beverage brewer 100 or can be external to the brewer. The base of the beverage brewer can include a hollow area for receiving the fuel container 216 that attaches to a base of the burner 224.

The manual cutoff 218 can be used to manually shut off the flow of fuel from the fuel container 216 to the burner 224 for long term storage. The manual cutoff 218 can be located before the fuel supply regulator 220 on the fuel supply path. The manual cutoff 218 can be used in situations where the fuel supply solenoid 222 and or the fuel supply regulator 220 are not functioning properly. The manual cutoff 218 can be used to close the fuel supply path when not in use to ensure that the beverage brewer 100 does not accidently operate unintendedly.

The gas regulator 220 can control the pressure of the gas input to the burner from the fuel container 216. In order to optimize the amount of power stored in the fuel container 216, the gas is pressurized in the fuel container 216. The gas regulator 220 controls the amount of gas that is allowed to exit the fuel container 216 by modulating the pressure of the gas that is exiting the fuel container 216. The gas regulator 220 is installed in the gas line of the beverage brewer 100.

The gas solenoid 222 can control the flow of gas from the fuel container 216. While the gas regulator 220 reduces the pressure of the gas, the gas solenoid 222 opens or closes the fuel path to the burner. The management circuits 204 can control the gas solenoid based on the operation of the beverage brewer 100 and the different sensors of the beverage brewer 100.

The burner 224 can evenly disperse the gases from the fuel container 216 across an exterior surface with the proper mixture of air. The burner 224 is in the fuel supply after the gas solenoid 222 and the gas regulator 220. The burner 224 distributes the exiting gases in manner to not allow the flames to reverse back to the fuel container. The flames from the burner 224 are distributed across the heat collector 230.

The ignition 226 can provide an ignition source for the burner 224. The ignition 226 can provide an electrical spark that causes the gases being released from the burner 224 to ignite. The battery 206 can provide the power to the ignition for creating the electrical spark. The ignition is located at the burner 224.

The flame sensor 228 can detect a flame coming from the burner 224. The flame sensor can be located between the burner 224 and the heat collector 230. The flame sensor 228 can also be located in proximity to the ignition 226. When a flame is detected from the ignition 226 or the burner 224, the flame sensor 228 can provide the information to the management circuits 204 or a corresponding ignition control circuit.

The heat collector 230 is connected to a supply side of the TEG 232. The heat collector 230 absorbs the heat generated from the ignited gases being distributed across the burner 224. The heat collector 230 can include a plurality of fins for absorbing heat. The heat collector 230 is made of a thermally conductive material for absorbing and transferring heat from the ignited gas of the burner to the TEG 232.

The TEG 232 can receive heat from the heat collector 230 on the supply side of the TEG 232 and output heat on the waste side of the TEG 232 and output electricity to the battery 206, the management circuits 204, the tilt sensor 208, the air pump 244, the gas solenoid 222, the flame sensor 228, the temperature sensor 238, or any other electrical component of the beverage brewer 100. While the TEG 232 powering the entire beverage brewer 100 is ideal for being portable, a separate charger could be included in different embodiments. The heat output on the waste side of the TEG 232 can be used to heat the brewing fluid in the reservoir 234.

The reservoir 234 can receive and store water or other liquid for the brewing process. The reservoir is located at the top of the beverage brewer 100, above the TEG 232. The water or brewing fluid is heated in the reservoir 234 before exiting or being pumped through the brewing chamber 252.

The thermal fuse 236 can be located outside, in side or as part of the reservoir 234. thermal fuse 234 can be set to different temperature thresholds. When the thermal fuse 234 reaches the respective temperature threshold, the electrical current is interrupted and the beverage brewer 100 is shut off.

The temperature sensor 238 is located at the reservoir 234. The temperature sensor 238 measures a temperature of the water in the reservoir 234. The temperature sensor 238 can also function to detect when the water inside the reservoir 234 has reached a specific level for brewing. The temperature sensor 238 can provide the information to the management circuits 204 or activate one of the status indicators 214 for a manual brewing initiated.

The fluid sensor 240 can be located in the reservoir 234. The fluid sensor 240 can be connected to the management circuit 204 to provide fluid levels of the reservoir 234. The management circuit 204 can perform operations of the brewing process based on the fluid level of the reservoir 234 detected by the fluid sensor 240. The fluid sensor 240 could function to be able to detect the level of the fluid in the reservoir 234 or detect a specific fill level of the reservoir. For example, a specific fill level of the reservoir 234 could be the amount of coffee to be brewed.

The liquid admittance valve 242 allows water or other brewing fluid to enter the reservoir 234, while not allowing reverse flow out of the reservoir 234. The liquid admittance valve is described in greater detail in regard to FIG. 5.

The air pump 244 can be located in the base or the top of the beverage brewer 100. The air pump 244 provides pressurized air to the reservoir for pumping the brewing fluid into the brewing chamber. The management circuits 204 can control the operation of the air pump 244. For example, the management circuits 204 can detect through the temperature sensor 238 that the brewing fluid in the reservoir 234 is at a brewing temperature and proceed to activate the air pump 244. The air pump 244 pressurizes the air in the reservoir 234 forcing the brewing fluid to flow to the brewing chamber 252.

The choke orifice 246 can be connected to the pneumatic line adjacent to the reservoir 234. The choke orifice 246 allows venting of the reservoir during the heating process to control the internal pressure in the reservoir. When the reservoir pressure build up during heating, the brewing fluid can prematurely begin to enter the brewing chamber before ideal brewing temperature is reached and not have the correct flavor profile for the single serving brew. Venting the reservoir allows for a more ideal brew management system.

The filter 248 is located on the pneumatic flow path between the air pump 244 and the reservoir 234. The filter 248 can filter out contaminants from the air to not be introduced into the un-brewed beverage.

The check valve 250 is located between the reservoir 234 and the brewing chamber 252. The check valve 250 is a one-way valve that allows the heated brewing fluid to transfer to the brewing chamber 242 and not return to the reservoir 234.

The brewing chamber 252 can be used to brew a single serving of coffee. The brewing chamber 252 can be accessed to receive a single serving of items for brewing, such as, for example, coffee grounds or tea leaves. The brewing chamber 252 receives heated water from the reservoir 234. The brewing chamber 252 can allow the heated water to flow through the single serving of coffee and out the brew dispenser 105.

Figure 3:
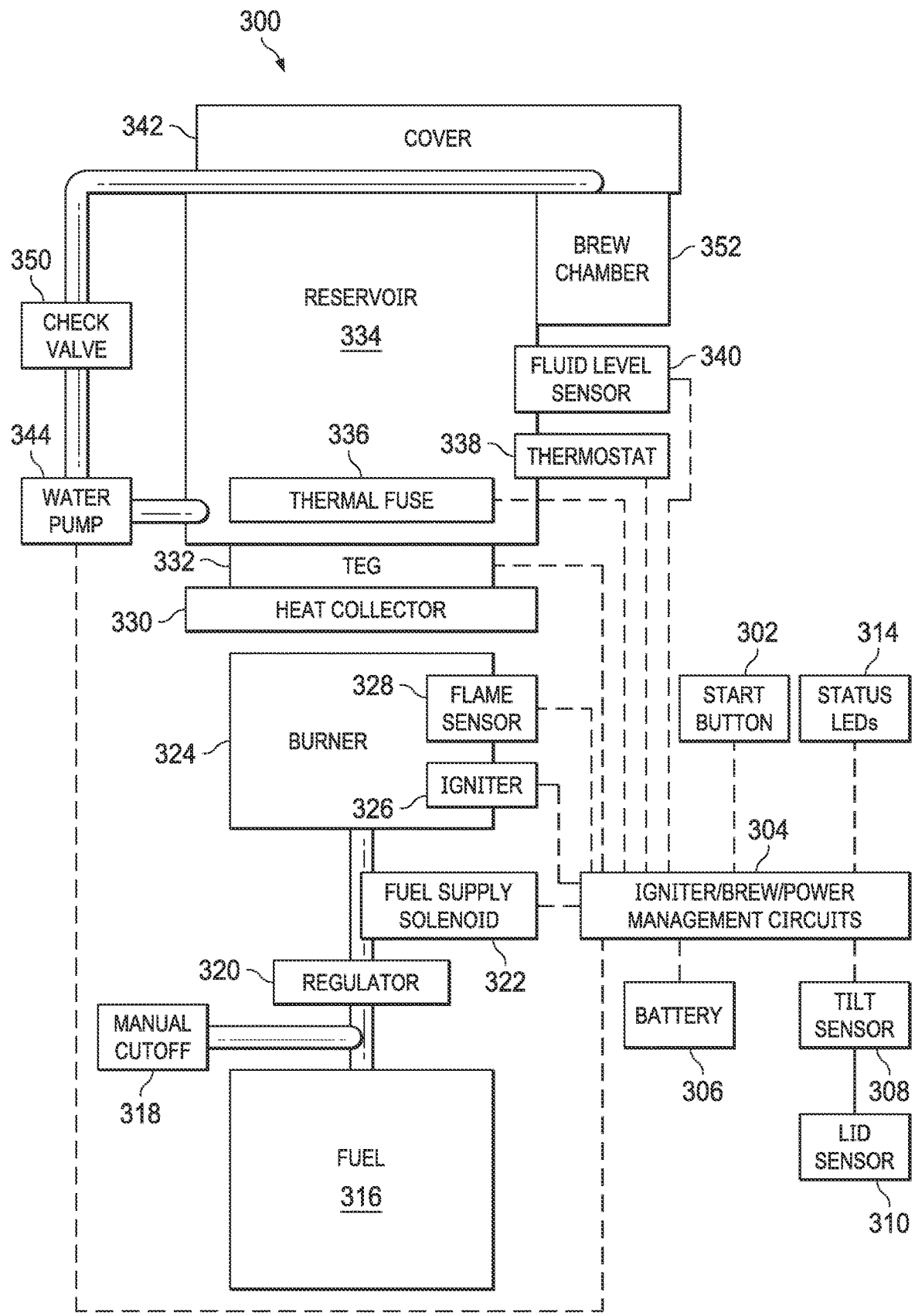
FIG. 3 illustrates an exemplary interior view for a non-electric powered, off-grid, beverage brewer in accordance with various embodiments of the present disclosure.

FIG. 3 illustrates an exemplary interior view 300 for a non-electric powered, off-grid, beverage brewer in accordance with various embodiments of the present disclosure. The embodiment of the interior view 300 illustrated in FIG. 3 is for illustration only. FIG. 3 does not limit the scope of this disclosure to any particular implementation of a beverage brewer.

The parts of the beverage brewer 100 include the components for brewing the coffee and regulating the control of the beverage brewer 100. These parts can include a start button 302, a management circuit 304, a battery 306, a tilt sensor 308, a lid sensor 310, one or more status LEDs 314, a fuel container 316, a manual cutoff 318, a regulator 320, a fuel supply solenoid 322, a burner 324, an igniter 326, a flame sensor 328, a heat collector 330, a thermoelectric generator 332, a reservoir 334, a thermal fuse 336 in the reservoir, a thermostat 338, a fluid level sensor 340, a water pump 344, a cover 342, a water pump 344, check valve 350 and a brewing chamber 352.

The start button 302 can be located on the exterior of the beverage brewer 100. The start button 302 can be depressed to begin the brewing process. The start button 302 can be connected to the management circuit 304. The start button 302 can cause the management circuit 304 to begin operating using stored power in the battery 306.

The management circuits 304 receives the sensor reading from the different tilt sensor 308, flame sensor 328, temperature sensor 338, etc. The management circuits 304 receive power from the battery 306 and the TEG 332. The management circuits 304 can control the different parts of the process of the beverage brewer 100 including controlling the burner 324, the ignition 326, the gas solenoid 322, the gas regulator 320, and the water pump 344.

The battery 306 is primarily charged by the TEG 332. The battery 306 can be a rechargeable battery that is used to power the electrical components of the beverage brewer 100. The battery 306 can store enough power to operate certain sensors and electrical components (spark igniter, pump, solenoid) related to the beverage brewer 100. For instance, when the start button 302 is activated, the battery 306 can provide power to open the gas solenoid and trigger the spark igniter to light the burner for heating the brewing fluid.

The tilt sensor 308 can be located at the base of the beverage brewer 100. The tilt sensor 308 is connected to the management circuits 304. When the beverage brewer 100 is tilted past a specific degree, the tilt sensor 308 can cause the management circuits 304 to shut off the burner 324. If the burner 324 is burning at an angle or upside, the beverage brewer 100 could start an unplanned fire or potential explosion. The management circuits 304 can be one or both of the igniter circuit and the brew cycle and power management circuit.

The lid sensor 310 can be mounted on the lid of the beverage brewer 100 and connected to the management circuit 304. The lid sensor 310 can detect when a lid or cover is attached to the beverage brewer 100. When the lid sensor 310 does not indicate to the management circuits 304 that the lid is attached, the management circuits shut down the beverage brewer 100.

The status indicators 314 can be located on an external part of the base of the beverage brewer and can indicate different statuses of the beverage brewer 100. For example, the status indicators 314 can include a temperature indicator, a completed indicator, a brewing indicator, a reservoir level indicator, etc. The status indicators 130 can be LEDs or other type of optical indicators. The status indicators 314 can be connected directly to the management circuits 304 or to different sensors, such as a tilt sensor 308, to indicate the measurement of the respective sensor.

The fuel container 316 can contain fuel meant for the burner 324. The fuel container 316 can be removable/replaceable. The fuel container 316 is located in the base of the beverage brewer 100 or can be exterior to the brewer. The base of the beverage brewer can include a hollow area for receiving the fuel container 316 that attaches to a base of the burner 324.

The manual cutoff 318 can be used to manually shut off the flow of fuel from the fuel container 316 to the burner 324 for long term storage. The manual cutoff 318 can be located before the fuel supply regulator 320 on the fuel supply path. The manual cutoff 318 can be used in situations where the fuel supply solenoid 322 and or the fuel supply regulator 320 are not functioning properly. The manual cutoff 318 can be used to close the fuel supply path when not in use to ensure that the beverage brewer 100 does not accidently operate unintendedly.

The gas regulator 320 can control the pressure of the gas input to the burner from the fuel container 316. In order to optimize the amount of power stored in the fuel container 316, the gas is pressurized in the fuel container 316. The gas regulator 320 controls the amount of gas that is allowed to exit the fuel container 316 by modulating the pressure of the gas that is exiting the fuel container 316. The gas regulator 320 is installed in the gas line of the beverage brewer 100.

The gas solenoid 322 can control the flow of gas from the fuel container 316. While the gas regulator 320 reduces the pressure of the gas, the gas solenoid 322 opens or closes the fuel path to the burner. The management circuits 304 can control the gas solenoid based on the operation of the beverage brewer 100 and the different sensors of the beverage brewer 100.

The burner 324 can evenly disperse the gases from the fuel container 316 across an exterior surface with the proper mixture of air. The burner 324 is in the fuel supply after the gas solenoid 322 and the gas regulator 320. The burner 324 distributes the exiting gases in manner to not allow the flames to reverse back to the fuel container. The flames from the burner 324 are distributed across the heat collector 330.

The ignition 326 can provide an ignition source for the burner 324. The ignition 326 can provide an electrical spark that causes the gases being released from the burner 324 to ignite. The battery 306 can provide the power to the ignition for creating the electrical spark. The ignition is located at the burner 324.

The flame sensor 328 can detect a flame coming from the burner 324. The flame sensor can be located between the burner 324 and the heat collector 330. The flame sensor 328 can also be located in proximity to the ignition 326. When a flame is detected from the ignition 326 or the burner 324, the flame sensor 328 can provide the information to the management circuits 304 or a corresponding ignition control circuit.

The heat collector 330 is connected to a supply side of the TEG 332. The heat collector 330 absorbs the heat generated from the ignited gases being distributed across the burner 324. The heat collector 330 can include a plurality of fins for absorbing heat. The heat collector 330 is made of a thermally conductive material for absorbing and transferring heat from the ignited gas of the burner to the TEG 332.

The TEG 332 can receive heat from the heat collector 330 on the supply side of the TEG 332 and output heat on the waste side of the TEG 332 and output electricity to the battery 306, the management circuits 304, the tilt sensor 308, the water pump 344, the gas solenoid 322, the flame sensor 328, the temperature sensor 338, or any other electrical component of the beverage brewer 100. While the TEG 332 powering the entire beverage brewer 100 is ideal for being portable, a separate charger could be included in different embodiments. The heat output on the waste side of the TEG 332 can be used to heat the brewing fluid in the reservoir 334.

The reservoir 334 can receive and store water or other liquid for the coffee brewing process. The reservoir is located at the top of the beverage brewer 100, above the TEG 332. The water or brewing fluid is heated in the reservoir 334 before exiting or being pumped through the brewing chamber 352.

The thermal fuse 336 can be located outside, inside or as part of the reservoir 334. Thermal fuse 334 can be set to different temperature thresholds. When the thermal fuse 334 reaches the respective temperature threshold, the electrical current is interrupted and the beverage brewer 100 is shut off.

The temperature sensor 338 is located at the reservoir 334. The temperature sensor 338 measures a temperature of the water in the reservoir 334. The temperature sensor 338 can also function to detect when the water inside the reservoir 334 has reached a specific level for brewing coffee. The temperature sensor 338 can provide the information to the management circuits 304 or activate one of the status indicators 314 for a manual brewing initiated.

The fluid sensor 340 can be located in the reservoir 334. The fluid sensor 340 can be connected to the management circuit 304 to provide fluid levels of the reservoir 334. The management circuit 304 can perform operations of the brewing process based on the fluid level of the reservoir 334 detected by the fluid sensor 340. The fluid sensor 340 could function to be able to detect the level of the fluid in the reservoir 334 or detect a specific fill level of the reservoir. For example, a specific fill level of the reservoir 334 could be the amount of coffee to be brewed.

The cover 342 can be removable for accessing the internal components of the beverage brewer 100. The cover 342 can complete the reservoir 334 for storing the brewing fluid as well as be removed for cleaning the reservoir 334 and adding more brewing fluid.

The water pump 344 can be located in the base or the top of the beverage brewer 100. The water pump 344 pumps the brewing fluid from the reservoir 334 to flow to the brewing chamber 352 through a back flow check valve 350. The management circuit 304 can control the operation of the water pump 344. For example, the management circuit 304 can detect through the temperature sensor 338 that the brewing fluid in the reservoir 334 is at a brewing temperature and proceed to activate the water pump 344.

The brewing chamber 352 can be used to brew a single serving of coffee. The brewing chamber 352 can be accessed to receive a single serving of items for brewing, such as, for example, coffee grounds or tea leaves. The brewing chamber 352 receives heated water from the reservoir 334. The brewing chamber 352 can allow the heated water to flow through the single serving of coffee and out the brew dispenser 105.

Figure 4:
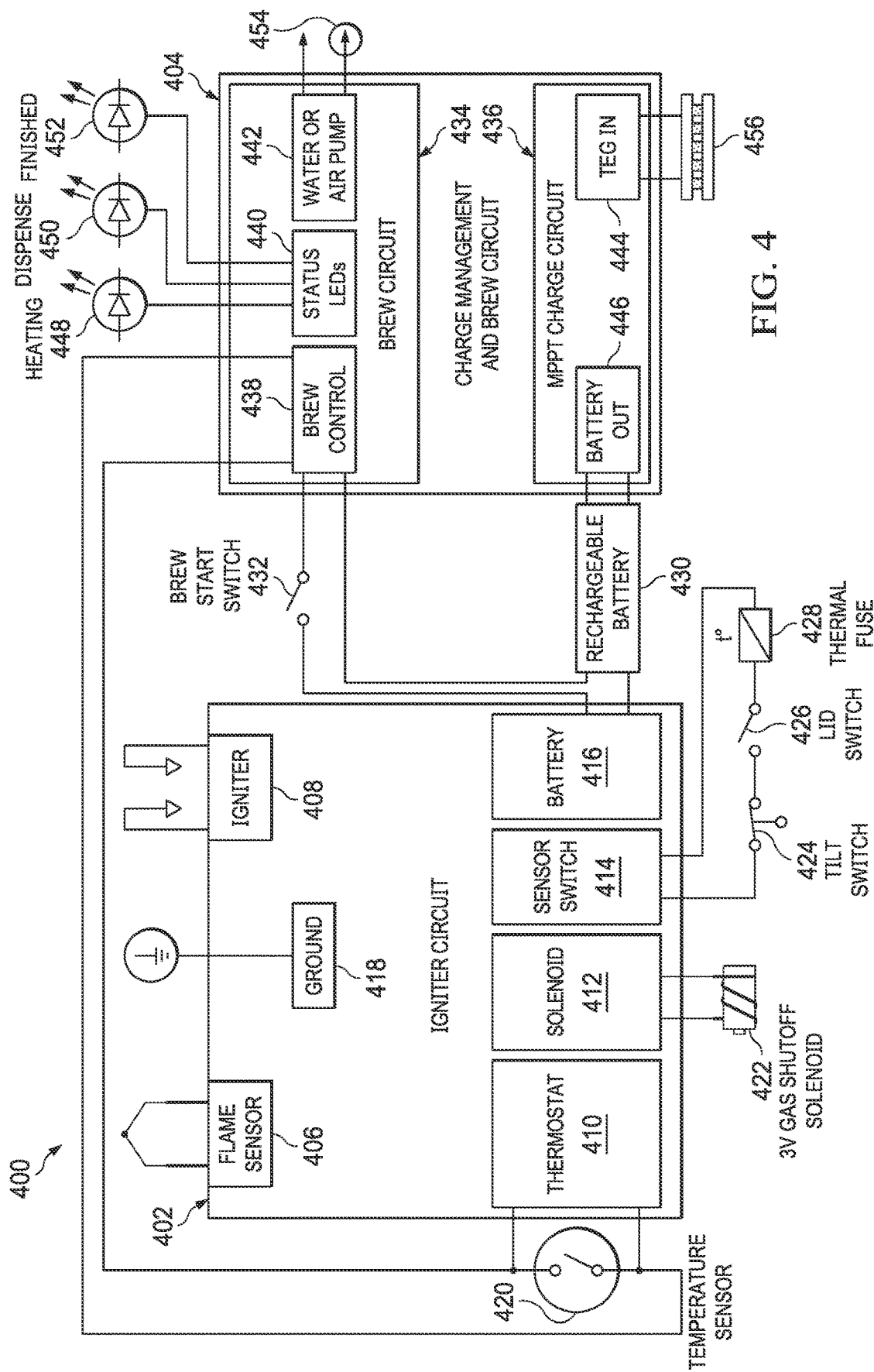
FIG. 4 illustrates an exemplary digital circuit block diagram for a non-electric powered, off-grid, beverage brewer in accordance with various embodiments of the present disclosure.

FIG. 4 illustrates an exemplary digital circuit block diagram 400 for a non-electric powered, off-grid, beverage brewer in accordance with various embodiments of the present disclosure. The embodiment of the digital circuit block diagram 400 illustrated in FIG. 4 is for illustration only. FIG. 4 does not limit the scope of this disclosure to any particular implementation of a beverage brewer.

The digital circuit diagram 400 includes components in the beverage brewer 100. The components can include an igniter circuit 402 and a charge management and brew circuit 404. The igniter circuit 402 can include a flame sensor 406, an igniter 408, thermostat 410, a solenoid 412, a sensor switch 414, a battery 416, and a ground 418. The igniter circuit 402 can connect to the temperature sensor 420, a gas shutoff solenoid 422, a normally-closed switch 424, a lid switch 426, a thermal fuse 428, a rechargeable battery, and a brew start switch 432. The charge management and brew circuit 404 can include a brew circuit 434 and a maximum power point tracking (MPPT) 436. The brew circuit can include a brew control 438, a status LEDs control 440, and a water or an air pump control 442. The MPPT circuit 436 can include a TEG control 444 and a battery control 446. The charge management and brew circuit 404 can be connected to the rechargeable battery 430, the brew start switch 432, a heating LED 448, a dispense LED 450, a finished LED 452, the air or water pump 454, the TEG 456.

The igniter circuit 402 receives a signal from the start switch to begin the brewing process. The igniter circuit 402 checks the sensors before dispensing gas to make sure the beverage brewer 100 is in an operable setting. The igniter circuit 402 activates the gas solenoid 422 to start fuel flow and ignites the burner. Once the igniter circuit 402 receives an indication from the temperature switch, the igniter circuit signals the brew circuit to continue the brewing process. The igniter 408 is controlled by the igniter circuit 435. The igniter 408 is used to ignite the fuel being dispensed from the burner. The igniter 408 can be a constant flame or a repetitive electric pulse used to ignite the fuel. The igniter circuit 402 can detect when the fuel is being dispensed from the fuel container and activate the igniter 408 accordingly. The igniter 408 can also be used when the flame sensor 406 detects that the flame went out for any reason to reignite the fuel dispensed out of the burner.

The thermostat 410 is part of the igniter circuit 402 and is connected to the temperature sensor input of the igniter circuit 420. The igniter circuit can receive a signal from the thermostat 420 and determines a temperature detected by the thermostat 420. The thermostat 410 can signal when the temperature of the reservoir is at a temperature for brewing the beverage. The thermostat 410 can monitor the temperature in the reservoir 234. The thermostat 410 can be activated upon detecting a brewing temperature of the brewing fluid in the reservoir 234. The thermostat 410 can relay a signal to the shut off the igniter circuit 435 and activate the brew circuit 470. When the temperature in the reservoir 234 reaches the brewing temperature, a status indicator can be activated.

The solenoid control 412 is connected to the gas shutoff solenoid 422. The solenoid control 412 can operate the shutoff solenoid 422 to control the flow of the gas from the gas container to the burner. The solenoid control 412 can signal the igniter circuit 402 that the gas shutoff solenoid is activated or a level of the flow allowed from the solenoid 422. The solenoid control 412 can control the flow of fuel from the fuel container to the burner. The igniter circuit 402 can open the gas solenoid 422 to release the flow of fuel to the burner. If the igniter circuit 402 detects a problem with the beverage brewer, the igniter circuit can close the gas solenoid to halt flow of the fuel to the burner. The gas solenoid is also of the normally closed type for safety. Should any interruption in the circuit occur (such as lost power), it automatically closes.

The sensor switch 414 can be connected to the normally-closed tilt switch 424, the lid switch 426 and the thermal fuse 428. The lid switch 426 can be located at the cover. The lid switch 426 can detect if the cover has been removed. When the cover is removed, the lid switch 426 can signal the igniter circuit 402 and the charge management and brew circuit 404 to shut off. The charge management and brew circuit 404 can use the signal from the lid switch 420 to control a status LED to indicate to the user of the beverage brewer 100 that the cover is not fully attached. The sensor switch can detect when the thermal fuse 428 is activated when a temperature of the reservoir exceeds a functioning temperature or a temperature that is too high for the brewing process.

The battery control 416 can control the power distribution to the igniter circuit from the rechargeable battery 430 and the TEG 456. The battery control 416 can cutoff the power from the battery 430 upon detecting that the beverage brewer is not in an operable state.

The rechargeable battery 430 is charged from the TEGs 456. The rechargeable battery 430 can be initially charged. The rechargeable battery 430 can provide power for all the electrical components of the beverage brewer 100. The brew start switch 432 is a switch to indicate the beginning of the brewing process which begins with the heating of the fluid in the reservoir.

The charge management and brew circuit 404 can control the brewing fluid portion of the brewing process. The charge management and brew circuit 404 can indicate to the user the power received from the TEGs 456 and the status of the brewing process through the status LEDs. The charge management and brew circuit 404 can also condition the raw power produced by the TEG 456 through an MPPT circuit 436. The charge management and brew circuit 404 can also serve as a charge management circuit for safely charging the storage element.

The brew control 438 is connected to the brew start switch 432 and the temperature sensor 420. The brew control 438 receives indication to begin the heating of the fluid in the reservoir when the brew switch is activated. The brew control 438 communicates with the other circuitry during the brewing process The status controls 440 can indicate the status of the brewing process during operation. The status control 440 can be powered by the rechargeable battery or by the TEGs 475. The status control 440 can operate a heating LED 448 while the igniter circuit is operating, a dispense LED while the charge management and brew circuit 404 is operating, and a finished LED 442 when the brewing process is completed.

The pump 454 is controlled by the pump control 442. The pump 454 can pump brewing fluid from the reservoir 234 to the brewing chamber 252. The pump 454 can be activated upon the temperature switch indicating that the water is sufficiently heated for the brewing process. The pump 454 can be powered by the rechargeable battery 430 and can have a status LED for indicating the pumping operation to the user.

The TEG control 444 can receive the power from the TEG and distribute the power accordingly. The battery control 446 can monitor the status of the battery and the power out of the MPPT circuit 436. The TEG 456 exclusively powers the entire beverage brewer 100. The power stored in the rechargeable battery can be provided from the TEG 456 for the next use of the beverage brewer 100. The heat from the burner 450 is spread across the supply side of the TEG 456 and a portion is converted to power the beverage brewer 100 and the remaining portion is used to heat the brewing fluid in the reservoir.

Figure 5:
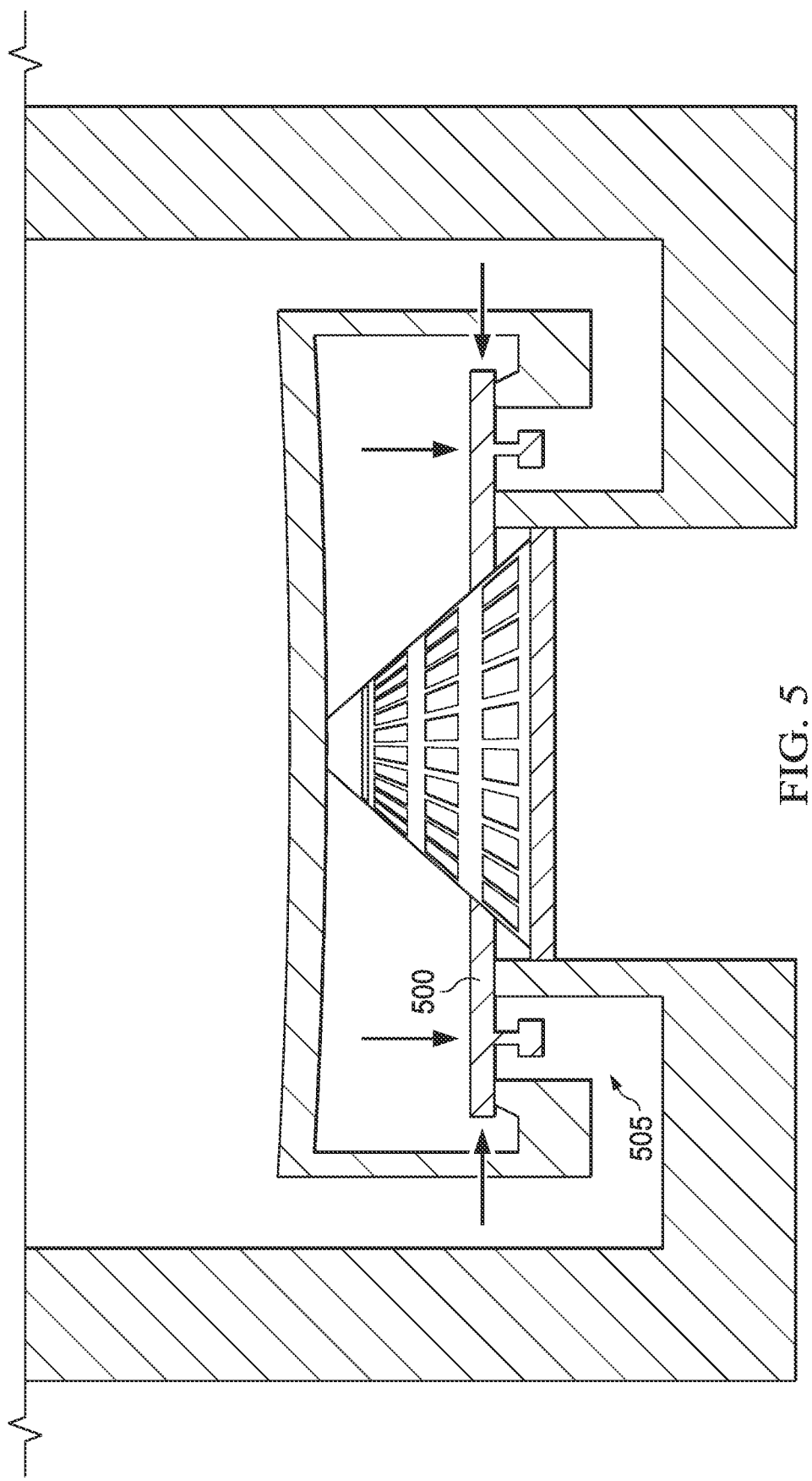
FIG. 5 illustrates an exemplary liquid admittance valve for a non-electric powered, off-grid, beverage brewer in accordance with various embodiments of the present disclosure.

FIG. 5 illustrates an exemplary liquid admittance valve 500 for a non-electric powered, off-grid, beverage brewer in accordance with various embodiments of the present disclosure. The embodiment of the liquid admittance valve 500 illustrated in FIG. 5 is for illustration only. FIG. 5 does not limit the scope of this disclosure to any particular implementation of a non-electric powered, off-grid, beverage brewer.

The liquid admittance valve 500 allows water to be added to the beverage brewer 100 without needing to remove any components or open any lids. The liquid admittance valve 500 blocks water in the reservoir from spilling out. Water can be supplied through the valve entrance 505. The lid of the beverage brewer 100 can include a pan around the valve entrance 505 or the beverage brewer 100 can be turned upside down to insert the water. The liquid admittance valve 500 allows the water to enter the reservoir, but does not allow the water or air to exit out the valve entrance 505, providing for a means of adding water and pressurizing the reservoir without the need for opening or closing of any lids by hand. The liquid admittance valve 500 accepts the brewing fluid in the reservoir without having to remove the reservoir cover.

Figure 6:
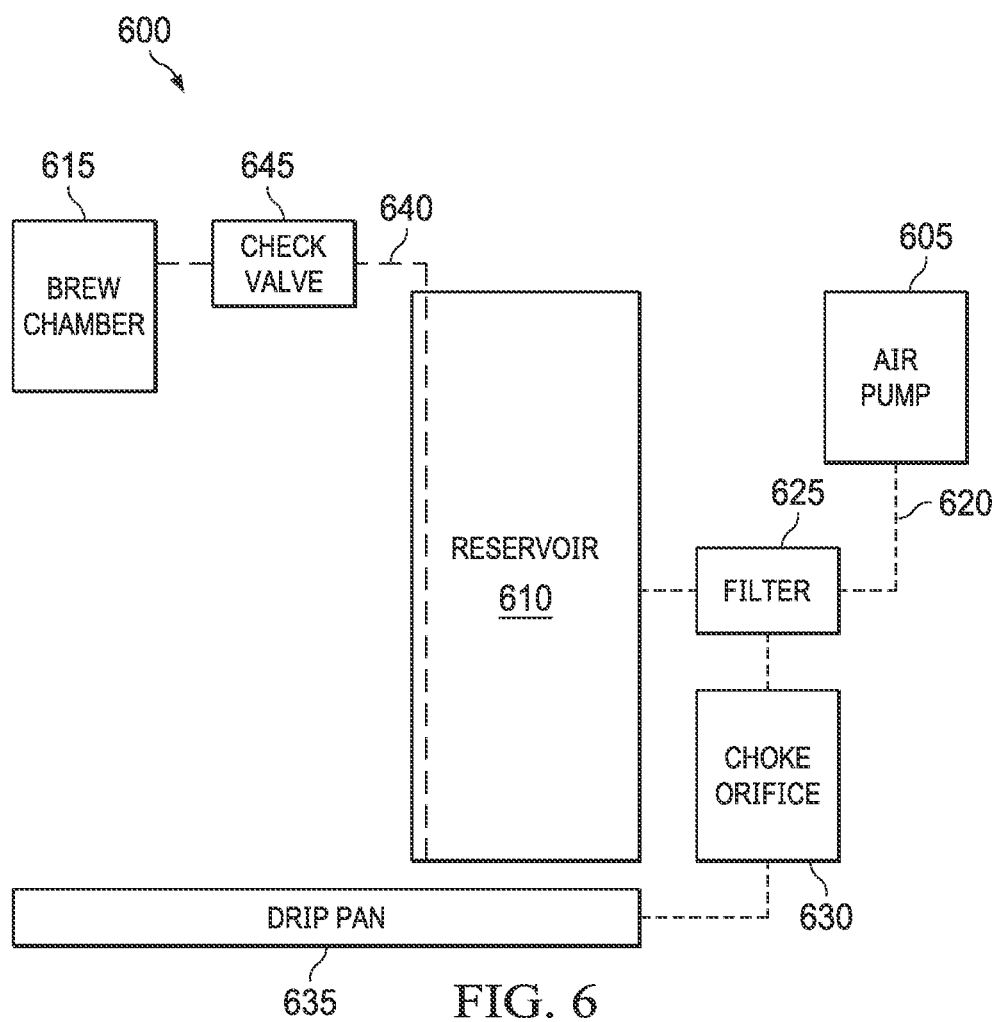
FIG. 6 illustrates an exemplary pneumatic circuit diagram for a non-electric powered, off-grid, beverage brewer in accordance with various embodiments of the present disclosure.

FIG. 6 illustrates an exemplary pneumatic circuit 600 for a non-electric powered, coffee maker in accordance with various embodiments of the present disclosure. The embodiment of the pneumatic circuit 600 illustrated in FIG. 6 is for illustration only. FIG. 6 does not limit the scope of this disclosure to any particular implementation of pneumatic circuit 600.

The pneumatic circuit 600 provides air pumped from an air pump 605 to the reservoir 610 to force water in the reservoir 610 into the brewing chamber 615. The pneumatic circuit 600 can include the air pump 605, the reservoir 610, the brewing chamber 615, one or more pneumatic lines 620, an air filter 625, a choke orifice 630, a drip pan 635, one or more fluid lines 640, and a check valve 645.

The air pump 605 can draw air from the outside of the beverage brewer 100. The air pump 605 can pressurize the air through the one or more pneumatic lines 620 through the filter to the reservoir 610.

The one or more pneumatic lines 620 connect the air pump 605, the filter 625, the reservoir 610, the choke orifice 630, and the drip pan 635. The pneumatic lines 620 move pressurized air from the air pump to the different components.

The filter 625 can remove any impurities from the pressurized air in order to maintain water purity in the reservoir 610. Pressurizing air could cause certain impurities in the air to affect water purity that would not be experienced at ambient pressure. The filter 625 removes these impurities to ensure that any condensates from the pressurized air will not enter the reservoir 610.

The impurities in the pressurized air in the pneumatic lines 620 is then passed through a choke orifice 630 to a drip pan 635.

The purified pressured air from the filter 625 is then transmitted to the reservoir 610. The air pressure input into the reservoirs 610 causes fluid stored in the reservoir to exit through the one or more fluid lines 640. The fluid lines 640 have a starting point at the base of the reservoir 610. As the air pressure increases at the top of the reservoir, the fluid is pushed out through the fluid lines 640 to the brewing chamber 615. The fluid lines 640 can include a check valve 645 to ensure that the fluids do not return to the reservoir 610 from the brewing chamber 615.

Figure 7:
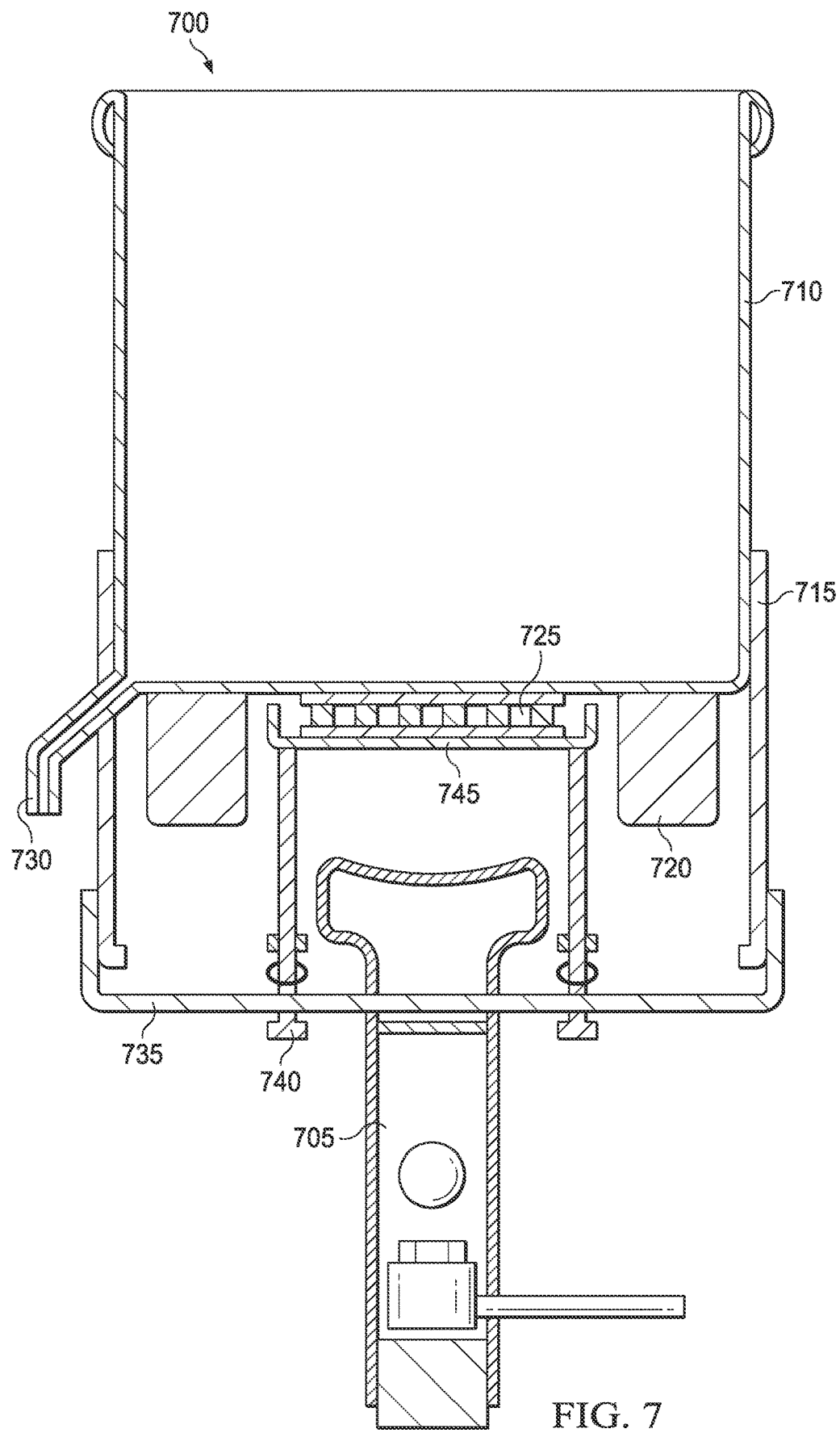
FIG. 7 illustrates a combination reservoir and burner assembly in accordance with various embodiments of the present disclosure.

FIG. 7 illustrates a combination reservoir and burner assembly 700 in accordance with various embodiments of the present disclosure. The embodiment of the combination reservoir and burner assembly 700 illustrated in FIG. 7 is for illustration only. FIG. 7 does not limit the scope of this disclosure to any particular implementation of combination reservoir and burner assembly 700.

The combination reservoir and burner assembly 700 can include a burner assembly 705, a reservoir 710, a resistance welded burner bracket 715, a thermal bypass fin 720, a TEG 725, a reservoir drain tube 730, a lock-on burner support plate 735, Belleville spring compression rods 740, and a hot plate 745. The burner assembly 710 receives gas from a container and ignites the gas below the hot plate 745. The aluminum reservoir 710 holds the brewing fluid and is heated by the waste side of the TEG 725. The burner bracket 715 can connect the burner assembly 705 to the bottom of the reservoir 710. The thermal bypass fin 720 can capture heat radiating from the burner assembly 705 to help heat the reservoir 710. The thermal bypass fins are arranged around the TEG 725. The TEG 725 converts heat captured by the hot plate 745 to electricity for the beverage brewer 100. The support plate 735 further supports the burner assembly 705. The combination reservoir and burner assembly 700 is connected by the spring compression rods 740.

Figure 8:
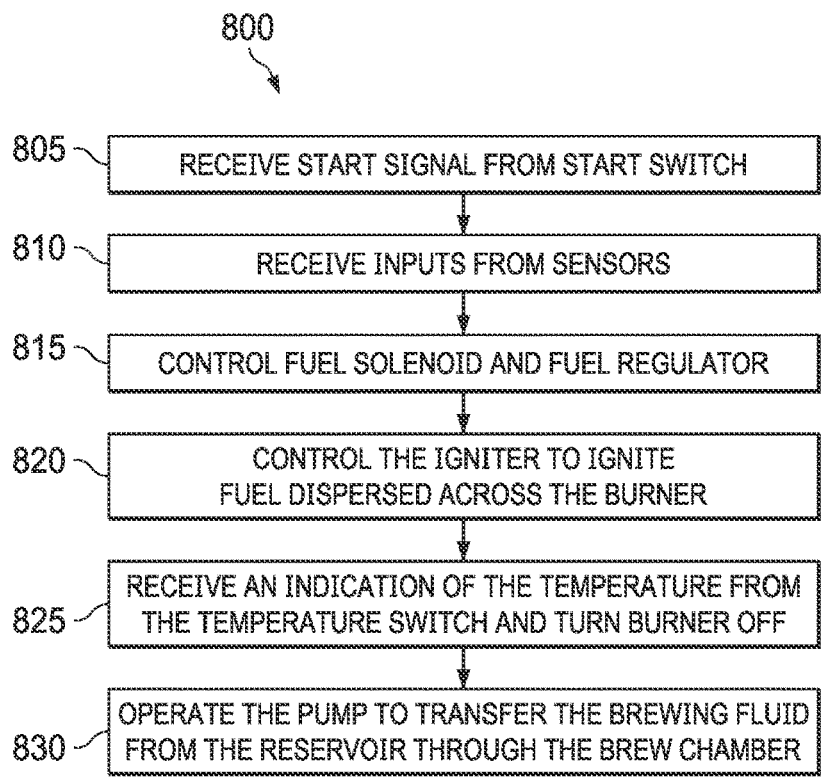
FIG. 8 illustrates a process for a non-electric powered, off-grid, beverage brewer in accordance with various embodiments of the present disclosure.

FIG. 8 illustrates a process for a non-electric powered, off-grid, single serve beverage brewer in accordance with various embodiments of the present disclosure. For example, the process depicted in FIG. 8 may be performed by the management circuits 204 illustrated in FIG. 2, the management circuit 304 illustrated in FIG. 3, the igniter circuit 435 and the power conditioning and brew circuit 470 illustrated in FIG. 4, and the electronic beverage brewer 900 in FIG. 9.

In operation 805, the electronic beverage brewer 900 can receive a start signal from the start switch 430. The start signal can initiate a single serving brewing process in the beverage brewer 100. The start switch 430 can be a mechanical switch or a user interface.

In operation 810, the electronic beverage brewer 900 can receive signals from the tilt sensor 410, the fluid sensor 415, and the lid switch 420, flame sensor, temperature sensor, temp fuse, to determine the operation status of the beverage brewer 100. The electronic beverage brewer 900 can receive an orientation measurement from the tilt sensor, a flame measurement from the flame sensor, a fluid level from the fluid sensor, a temperature measurement from the temperature sensor, etc. The respective measurements can be processed to ensure the operational requirements for the beverage brewer. An example of an operational requirement can include that the beverage brewer is at a substantially vertical orientation.

In operation 815, the electronic beverage brewer 900 can control the gas solenoid 445 to release fuel from the fuel container to the burner 450. The fuel stored in the fuel container is highly pressurized in order to use the burner for an extended period of time. The pressure of the fuel in the fuel container is too high to use safely without reducing the pressure. The fuel regulator is used to reduce the storage pressure to an operational pressure. The gas solenoid is used to open or close the fuel path from the fuel container to the burner. The fuel is dispersed across the burner for even heat to be applied to a hot sink or the supply side of the thermoelectric generator.

In operation 820, the electronic beverage brewer 900 can control the igniter to ignite the fuel across the surface of the burner 450. The electronic beverage brewer 900 can start the igniter when the gas solenoid is opened and fuel is flowing to the burner. The igniter can also be used when the flame is no longer detected by the flame sensor, but the solenoid has not yet been closed.

The flame provides heat to hot sink or directly to the supply side of the thermoelectric generator. The thermoelectric generator converts a portion of the heat into electricity to be output for the use of powering the components of the beverage brewer. This power supply from the conversion of the combusted heat on the supply side of the thermoelectric generators is enough to solely power the entire beverage brewer. The remaining heat is transferred to the waste side of the thermoelectric generator, which is connected to the reservoir for heating the brewing fluids.

In operation 825, the beverage brewer 900 can receive an indication of the temperature from the temperature switch 405. The temperature switch measures a temperature of the brewing fluid stored in the reservoir. Once the brewing fluid is adequately heated by the waste side of the thermoelectric generator, the electronic device can begin the brewing part of the operation.

In operation 830, the electronic beverage brewer 900 can operate the pump 465 to transfer the brewing fluid from the reservoir to the brewing chamber 252. In certain embodiments, a pneumatic pump is used to pump air into the reservoir creating a pressure on the fluid to exit to the brewing chamber through a fluid line. In other embodiments, a fluid pump is used to pump the brewing fluid from the reservoir to the brewing chamber. Both the pneumatic pump and the fluid pump could be used in combination for the beverage brewer.

Although FIG. 8 illustrates an example a process for operating a non-electric powered, off-grid, beverage brewer, respectively, various changes could be made to FIG. 8. For example, while shown as a series of steps, various steps in each figure could overlap, occur in parallel, occur in a different order, or occur multiple times.

Figure 9:
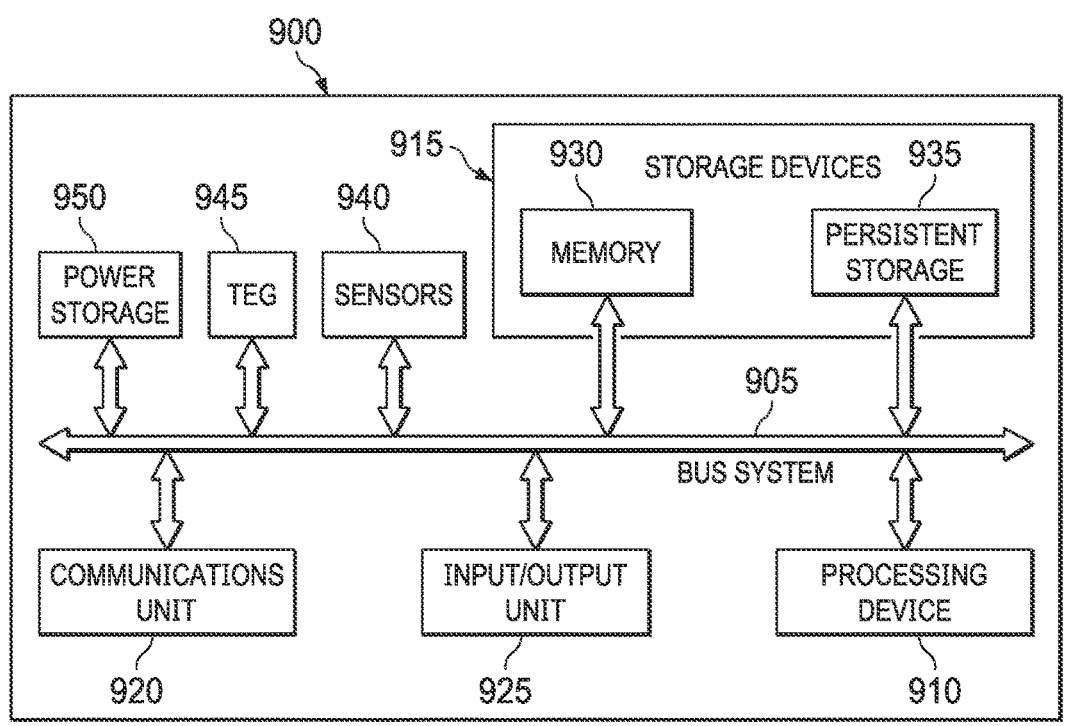
FIG. 9 illustrates an example device implemented with a non-electric powered, off-grid, beverage brewer according to this disclosure.

FIG. 9 illustrates an example beverage brewer 900 according to this disclosure. The embodiment shown in FIG. 9 is for illustration only. Other embodiments could be used without departing from the scope of the present disclosure.

As shown in FIG. 9, the electronic beverage brewer 900 includes a bus system 905, which supports communication between at least one processing device 910, at least one storage device 915, at least one communications unit 920, at least one input/output (I/O) unit 925, at least one sensor 940, a TEG 945, and a power storage 950.

The processing device 910 can be the management circuits 204 illustrated in FIG. 2, the management circuit 304 illustrated in FIG. 3, the igniter circuit 435 illustrated in FIG. 4, and the power conditioning and brew circuit 470 illustrated in FIG. 4. The processing device 910 executes instructions that may be loaded into a memory 930. The processing device 910 may include any suitable number(s) and type(s) of processors or other devices in any suitable arrangement. Example types of processing devices 910 include microprocessors, microcontrollers, digital signal processors, field programmable gate arrays, application specific integrated circuits, and discreet circuitry. The processing device 910 can be programmable or can download brewing parameters for brewing a single serving of coffee. Cycle parameters can include brewing temperature and brewing time.

The memory 930 and a persistent storage 935 are examples of storage devices 915, which represent any structure(s) capable of storing and facilitating retrieval of information (such as data, program code, and/or other suitable information on a temporary or permanent basis). The memory 930 may represent a random access memory or any other suitable volatile or non-volatile storage device(s). The persistent storage 935 may contain one or more components or devices supporting longer-term storage of data, such as a ready only memory, hard drive, flash memory, or optical disc. The persistent storage 935 includes the instructions for determining the operating status of the beverage brewer 100 and operations for brewing a single serving of coffee.

The communications unit 920 supports communications with other systems or devices. For example, the communications unit 920 could include a network interface card or a wireless transceiver facilitating communications over the network. The communications unit 920 may support communications through any suitable physical or wireless communication link(s). The communications unit 920 could communicate with a wireless device for control of the non-electric powered, off-grid, single serve beverage brewer 100.

The I/O unit 925 can include the start buttons and various status indicators illustrated in FIGS. 1-4. The status indicators can also include a plurality of LEDs that indicate specific operating statuses, such as heating, charging, standby, etc. The I/O unit 925 allows for input and output of data. For example, the I/O unit 925 may provide a connection for user input through a button, a touchscreen, or other suitable input device. The I/O unit 925 may also send output to LEDS, a display, or other suitable output device. A display could present programming and information to a user.

The sensor 940 can include any of the various sensors illustrated in FIGS. 1-4. The sensors 940 can provide feedback of the flames on the burner, the temperature of the brewing fluid, the fill level of the brewing fluid, the angle of tilt of the beverage brewer 100, etc. to the user or stored in the storage device 915. Sensors 940 can include temperature sensors, pressure sensors, tilt sensors, etc.

The TEG can include the TEG 232 illustrated in FIG. 2, the TEG 332 illustrated in FIG. 3, and TEGs 475 illustrated in FIG. 4. The TEG 945 provides power to the different components of the electronic device, either directly or through bus 905. The TEG 945 can power an internal rechargeable battery or power storage 950 for start-up purposes. The TEG 945 can fully charge the electrical components of the device without any outside power source. The power storage 950 can be powered by the TEG 945 and distribute power to other components or the power can be directly supplied by the TEG 945 to the different components.

Although FIG. 9 illustrates an example of an electronic beverage brewer 900, various changes may be made to FIG. 9. For example, various components in FIG. 9 could be combined, further subdivided, or omitted and additional components could be added according to particular needs. As a particular example, the processing device 910 could be divided into multiple processors, such as one or more central processing units (CPUs) and one or more graphics processing units (GPUs). In addition, as with computing and communication networks, electronic devices can come in a wide variety of configurations, and FIG. 9 does not limit this disclosure to any particular electronic device.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. An apparatus for brewing a beverage from a brewing fluid, the apparatus comprising:
    a burner configured to produce combustible heat across a heat collector;
    a reservoir in thermal communication with the heat collector and configured to hold the brewing fluid, the reservoir comprising a base;
    a support that supports the burner in a vertical orientation below the base;
    compression rods supported by the support, the compression rods support the heat collector;
    a brew chamber in fluid communication with the reservoir;
    a pump configured to directly or indirectly pump the brewing fluid from the reservoir to the brew chamber;
    brew circuitry configured to control the pump and the burner in a brewing process of the brewing fluid from the reservoir to the brew chamber; and
    a power source comprising a thermoelectric generator, the power source being incorporated into the apparatus and being configured to power the brew circuitry,
    wherein the heat collector compresses the thermoelectric generator against the base of the reservoir.

2. The apparatus of claim 1, wherein the thermoelectric generator comprises a supply side, a waste side, and a power output, wherein the supply side is directed towards the heat collector, the waste side contacts the reservoir, and the power output is configured to power to the brew circuitry and the pump.

3. The apparatus of claim 1, wherein the power source further comprises a battery.

4. The apparatus of claim 3, wherein the battery is configured to power the brew circuitry at least during a start-up of the brewing process; and
    wherein the thermoelectric generator comprises a supply side, a waste side, and a power output, the supply side is directed towards the heat collector, the waste side contacts the reservoir, and the power output is configured to power the brew circuitry at least after the start-up of the brewing process.

5. The apparatus of claim 3, wherein the thermoelectric generator comprises a supply side, a waste side, and a power output, wherein the supply side is directed towards the heat collector, the waste side contacts the reservoir, and the power output is configured to recharge the battery.

6. The apparatus of claim 5, wherein the battery is configured to power the brew circuitry at least during a start-up of the brewing process; and
    wherein the power output of the thermoelectric generator is configured to power the brew circuitry at least after the start-up of the brewing process.

7. The apparatus of claim 1, wherein the burner comprises:
    a fuel connection for a fuel container;
    a fuel regulator located after the fuel connection on a fuel supply path and configured to reduce a pressure of fuel on the fuel supply path;
    a fuel solenoid located on the fuel supply path after the fuel regulator and configured to control a flow of fuel to the burner; and
    an igniter configured to ignite the fuel dispersed across the burner.

8. The apparatus of claim 1, comprising at least one of:
    a tilt sensor configured to detect a tilt of the apparatus and configured to shut off the burner in response to the apparatus being tilted; or
    a switch configured to detect a cover for the reservoir and configured to shut off the burner in response to detecting that the cover is open.

9. The apparatus of claim 1, wherein the pump is:
    a water pump configured to pump the brewing fluid from the reservoir to the brew chamber; or
    a pneumatic pump configured to pump air into the reservoir, and a fluid line configured to transfer the brewing fluid from the reservoir to the brew chamber in response thereto.

10. The apparatus of claim 1, further comprising a liquid admittance valve configured to accept the brewing fluid in the reservoir without having to remove a reservoir cover of the apparatus.

11. The apparatus of claim 1, further comprising thermal bypass fins connected to a base of the reservoir and configured to transfer radiant heat from the burner to the reservoir.

12. The apparatus of claim 1, wherein the brew circuitry is configured to control the pump to transfer the brewing fluid from the reservoir to the brew chamber after the brewing fluid has reached a temperature.

13. The apparatus of claim 1, further comprising a controller that comprises the brew circuitry,
wherein the controller is configured to control the pump and the burner in a brewing process of the brewing fluid from the reservoir to the brew chamber and the controller is configured to manage power from the thermoelectric generator.

14. The apparatus of claim 1, wherein:
the compression rods and the burner extend through the support, and
the compression rods straddle the burner.

15. The apparatus of claim 1, wherein the heat collector is interposed between the thermoelectric generator and an entirety of the compression rods.

16. A method for brewing a beverage, the method comprising:
controlling, using brew circuitry of a beverage brewer, a burner of the beverage brewer to produce combustible heat across a heat collector, the burner being supported by a support in a vertical orientation below a base of a reservoir of the beverage brewer that stores a brewing fluid, the support further supports compression rods that support the heat collector, and the heat collector compresses a thermoelectric generator of a power source of the beverage brewer against the base of the reservoir;
controlling, using the brew circuitry, a pump to communicate the brewing fluid from the reservoir to a brew chamber of the beverage brewer in a brewing process;
powering the brew circuitry with the power source; and
at least one of:
detecting that the beverage brewer is not upright using a tilt sensor, and shutting off the burner in response to the beverage brewer not being upright; or
detecting that a cover for the reservoir is open using a lid switch, and shutting off the burner in response to detecting that the cover is open.

17. The method of claim 16, wherein powering the brew circuitry with the power source comprises utilizing the thermoelectric generator, and
wherein the method further comprises powering the pump with the thermoelectric generator.

18. The method of claim 16, wherein powering the brew circuitry with the power source incorporated into the beverage brewer comprises utilizing a battery of the power source.

19. The method of claim 18, wherein utilizing the battery to provide the power comprises powering the brew circuitry with the battery at least during a start-up of the brewing process; and
wherein providing the power to the brew circuitry utilizing the power source incorporated into the beverage brewer further comprises utilizing the thermoelectric generator to provide the power at least after the start-up of the brewing process.

20. The method of claim 18, wherein providing the power to the brew circuitry utilizing the power source further comprises recharging the battery using the thermoelectric generator.

21. The method of claim 20, wherein powering the brew circuitry comprises:
utilizes the battery at least during a start-up of the brewing process; and
utilizes the thermoelectric generator at least after the start-up of the brewing process.

22. The method of claim 16, wherein controlling, using the brew circuitry, the pump comprises:
pumping the brewing fluid, with the pump, from the reservoir to the brew chamber; or
pumping air into the reservoir, with the pump, and communicating the brewing fluid forced by the air through a fluid line to the brew chamber.

23. The method of claim 16, further comprising accepting the brewing fluid in the reservoir using a liquid admittance valve without opening a reservoir cover of the beverage brewer.

24. The method of claim 16, wherein controlling, using the brew circuitry, the pump to communicate the brewing fluid from the reservoir to the brew chamber of the beverage brewer occurs after the brewing fluid has reached a temperature.

25. The method of claim 16, wherein the powering comprises powering a controller of the beverage brewer that comprises the brew circuitry with the power source, and the method further comprises managing, using the controller, power produced by the power source.

* * * * *